United States Patent
Perzlmaier et al.

(10) Patent No.: US 10,985,306 B2
(45) Date of Patent: Apr. 20, 2021

(54) OPTOELECTRONIC SEMICONDUCTOR CHIP

(71) Applicant: OSRAM Opto Semiconductors GmbH, Regensburg (DE)

(72) Inventors: Korbinian Perzlmaier, Regensburg (DE); Christian Leirer, Friedberg (DE)

(73) Assignee: OSRAM OLED GmbH, Regensburg (DE)

( * ) Notice: Subject to any disclaimer, the term of this patent is extended or adjusted under 35 U.S.C. 154(b) by 35 days.

(21) Appl. No.: 15/750,565

(22) PCT Filed: Jul. 22, 2016

(86) PCT No.: PCT/EP2016/067576
§ 371 (c)(1),
(2) Date: Feb. 6, 2018

(87) PCT Pub. No.: WO2017/025299
PCT Pub. Date: Feb. 16, 2017

(65) Prior Publication Data
US 2019/0027669 A1      Jan. 24, 2019

(30) Foreign Application Priority Data
Aug. 12, 2015 (DE) ............... 10 2015 113 310.5

(51) Int. Cl.
*H01L 33/64* (2010.01)
*H01L 33/48* (2010.01)
(Continued)

(52) U.S. Cl.
CPC .......... *H01L 33/647* (2013.01); *H01L 31/024* (2013.01); *H01L 31/02005* (2013.01);
(Continued)

(58) Field of Classification Search
CPC ....... H01L 33/48; H01L 33/62; H01L 33/647; H01L 31/0203; H01L 33/486;
(Continued)

(56) References Cited

U.S. PATENT DOCUMENTS

2003/0168664 A1    9/2003  Hahn et al.
2005/0127382 A1*   6/2005  Groetsch ............... H01L 24/97
                                                          257/94
(Continued)

FOREIGN PATENT DOCUMENTS

DE    10 2010 025 320 A1    12/2011
DE    10 2011 015 821 A1    10/2012
(Continued)

OTHER PUBLICATIONS

Decision for the Opinion of Examination dated Apr. 25, 2018, from corresponding Taiwanese Patent Application No. 105123572 in English.

*Primary Examiner* — Mohsen Ahmadi
(74) *Attorney, Agent, or Firm* — DLA Piper LLP (US)

(57) ABSTRACT

A semiconductor chip includes an electrically insulating layer including a first opening and a second opening, an electrically conductive first connection point, and an electrically conductive second connection point, wherein a carrier mechanically connects to a semiconductor body, the active region electrically connects to a first conductor body and a second conductor body, the electrically insulating layer covers the carrier on a side thereof facing away from the semiconductor body, the first connection point electrically connects to the first conductor body through the first opening, the second connection point electrically connects to the second conductor body through the second opening, the first conductor body is at a first distance from a second conductor body, the first connection point is at a second (Continued)

distance from the second connection point, and the first distance is less than the second distance.

16 Claims, 3 Drawing Sheets

(51) Int. Cl.

| | | |
|---|---|---|
| H01L 33/60 | (2010.01) | |
| H01L 33/38 | (2010.01) | |
| H01L 33/62 | (2010.01) | |
| H01L 31/105 | (2006.01) | |
| H01L 31/02 | (2006.01) | |
| H01L 31/0232 | (2014.01) | |
| H01L 31/024 | (2014.01) | |
| H01L 33/20 | (2010.01) | |
| H01L 33/10 | (2010.01) | |
| H01L 31/0216 | (2014.01) | |
| H01L 31/0224 | (2006.01) | |
| H01L 33/44 | (2010.01) | |

(52) U.S. Cl.
CPC ...... *H01L 31/02325* (2013.01); *H01L 31/105* (2013.01); *H01L 33/486* (2013.01); *H01L 33/60* (2013.01); *H01L 33/62* (2013.01); *H01L 31/02161* (2013.01); *H01L 31/022408* (2013.01); *H01L 33/10* (2013.01); *H01L 33/20* (2013.01); *H01L 33/38* (2013.01); *H01L 33/382* (2013.01); *H01L 33/44* (2013.01); *H01L 33/64* (2013.01)

(58) Field of Classification Search
CPC ......... H01L 33/64; H01L 33/10; H01L 33/20; H01L 33/38; H01L 33/405
See application file for complete search history.

(56) References Cited

U.S. PATENT DOCUMENTS

| | | | |
|---|---|---|---|
| 2008/0006913 A1* | 1/2008 | Stecher | H01L 23/36 257/667 |
| 2014/0054635 A1* | 2/2014 | Herrmann | H01L 33/382 257/98 |
| 2014/0151724 A1* | 6/2014 | Herrmann | H01L 33/62 257/88 |
| 2014/0186979 A1 | 7/2014 | Tu et al. | |
| 2015/0024550 A1* | 1/2015 | Voerckel | H01L 21/56 438/113 |
| 2015/0041845 A1* | 2/2015 | Schwarz | H01L 33/54 257/99 |
| 2015/0243857 A1* | 8/2015 | Sabathil | H01L 33/56 257/98 |
| 2015/0249072 A1* | 9/2015 | Herrmann | H01L 23/60 257/99 |
| 2016/0003436 A1* | 1/2016 | Singer | F21S 45/47 362/543 |
| 2016/0056358 A1* | 2/2016 | Moosburger | H01L 33/486 257/99 |
| 2016/0141286 A1* | 5/2016 | Holz | H01L 25/167 257/88 |

FOREIGN PATENT DOCUMENTS

| | | |
|---|---|---|
| DE | 10 2012 217 533 A1 | 3/2014 |
| DE | 10 2013 111 496 A1 | 4/2015 |
| EP | 2 669 965 A2 | 12/2013 |
| EP | 2 680 326 A2 | 1/2014 |
| EP | 2 833 421 A1 | 2/2015 |
| KR | 10-1362081 B1 | 2/2014 |
| TW | 201505212 A | 2/2015 |
| WO | 2012/164437 A2 | 12/2012 |
| WO | WO-2014191280 A1 * | 12/2014 ............ H01L 25/16 |

* cited by examiner

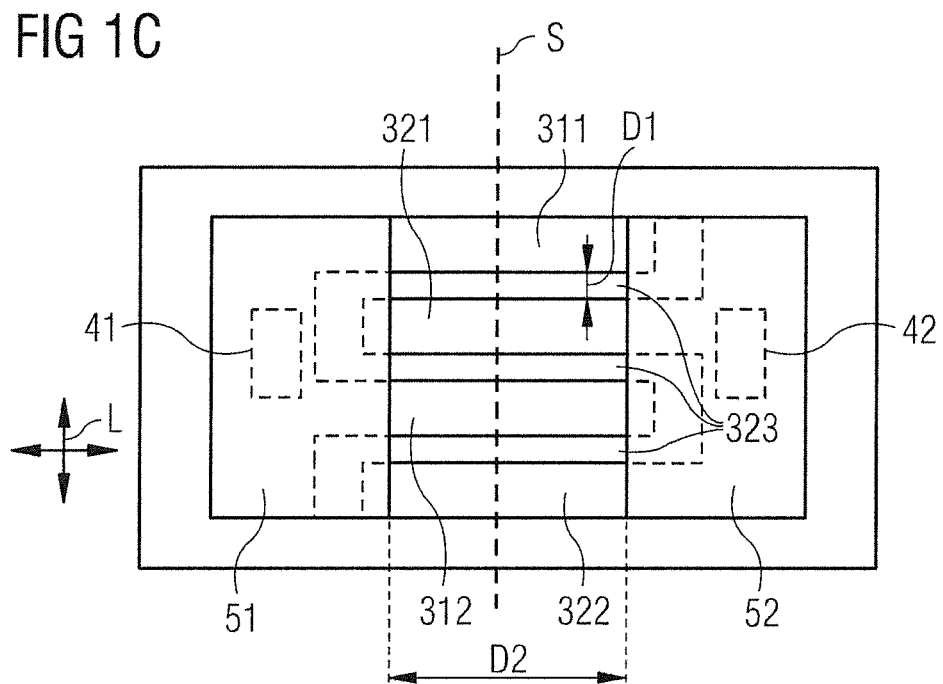

OPTOELECTRONIC SEMICONDUCTOR CHIP

TECHNICAL FIELD

This disclosure relates to a semiconductor chip.

BACKGROUND

US 2003/0168664 A1 describes a semiconductor chip. There is nonetheless a need for a semiconductor chip having particularly good thermal properties.

SUMMARY

We provide a semiconductor chip including a semiconductor body including an active region, a carrier including a first conductor body, a second conductor body and a shaped body, an electrically insulating layer including a first opening and a second opening, an electrically conductive first connection point, and an electrically conductive second connection point, wherein the carrier mechanically connects to the semiconductor body, the active region electrically connects to the first conductor body and the second conductor body, the electrically insulating layer covers the carrier on the side thereof facing away from the semiconductor body, the first connection point electrically connects to the first conductor body through the first opening, the second connection point electrically connects to the second conductor body through the second opening, the first conductor body is at a first distance from a second conductor body, the first connection point is at a second distance from the second connection point, and the first distance is less than the second distance.

We also provide a semiconductor chip including a semiconductor body including an active region, a carrier including a first conductor body, a second conductor body and a shaped body, an electrically insulating layer including a first opening and a second opening, an electrically conductive first connection point, and an electrically conductive second connection point, wherein the carrier mechanically connects to the semiconductor body, the active region electrically connects to the first conductor body and the second conductor body, the electrically insulating layer covers the carrier on the side thereof facing away from the semiconductor body, the first connection point electrically connects to the first conductor body through the first opening, the second connection point electrically connects to the second conductor body through the second opening, the first conductor body is at a first distance from a second conductor body, the first connection point is at a second distance from the second connection point, the first distance is less than the second distance, and at least one of the conductor bodies includes at least one protrusion, wherein at least one protrusion extends from the at least one conductor body towards the other conductor body.

We further provide a semiconductor chip including a semiconductor body including an active region, a carrier including a first conductor body, a second conductor body and a shaped body, an electrically insulating layer including a first opening and a second opening, an electrically conductive first connection point, and an electrically conductive second connection point, wherein the carrier mechanically connects to the semiconductor body, the active region electrically connects to the first conductor body and the second conductor body, the electrically insulating layer covers the carrier on the side thereof facing away from the semiconductor body, the first connection point electrically connects to the first conductor body through the first opening, the second connection point electrically connects to the second conductor body through the second opening, the first conductor body is at a first distance from a second conductor body, the first connection point is at a second distance from the second connection point, the first distance is less than the second distance, and the first connection point is surrounded in lateral directions by the first opening and has a smaller cross-sectional area than the first opening and/or the second connection point is surrounded in lateral directions by the second opening and has a smaller cross-sectional area than the second opening.

BRIEF DESCRIPTION OF THE DRAWINGS

FIGS. 1B and 1C show top view diagrams of bottom sides of examples of semiconductor chips.

LIST OF REFERENCE SIGNS

Figure 1A:
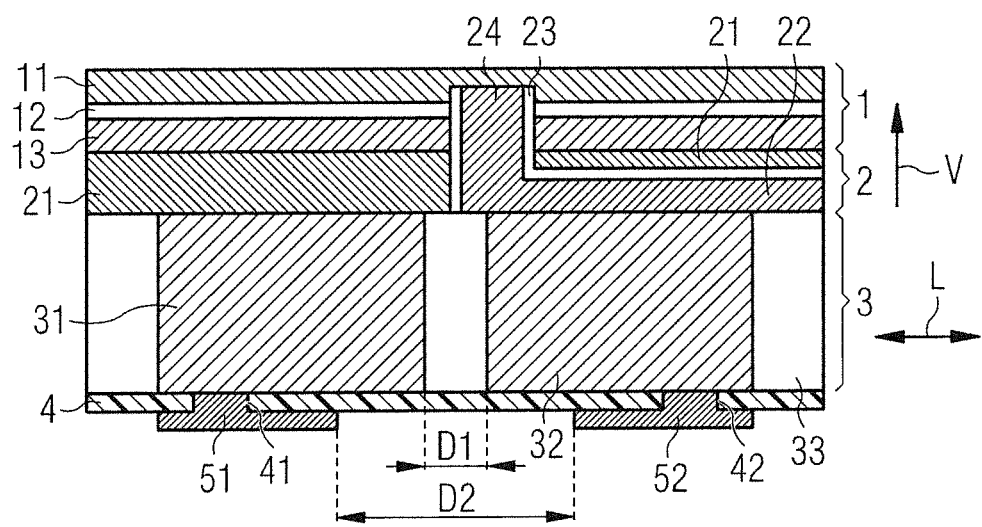
FIG. 1A shows an example of a semiconductor chip in a sectional diagram.

1 Semiconductor body
11 First conductive region
12 Active region
13 Second conductive region
2 Connecting region
21 First contact layer
22 Second contact layer
23 Insulation layer
24 Through-connection
3 Carrier
31 First conductor body
32 Second conductor body
33 Shaped body
4 Electrically insulating layer
41 First opening
42 Second opening
51 First connection point
52 Second connection point
D1 First distance
D2 Second distance
311,312,321,322 Protrusion
323 Recessed region

DETAILED DESCRIPTION

Our semiconductor chip is, e.g., an electronic or optoelectronic semiconductor chip. In particular, the semiconductor chip can be a chip that detects or emits electromagnetic radiation, in particular light, during operation.

The semiconductor chip may comprise a semiconductor body comprising an active region. The semiconductor body contains one or more layers of a semiconductor material. In the active region of the semiconductor chip, a function of the semiconductor chip such as, e.g., a detection or emission of electromagnetic radiation, is performed during operation of the semiconductor chip. The semiconductor body can be based, e.g., on a III/V compound semiconductor material.

The semiconductor chip may comprise a carrier comprising a first conductor body, a second conductor body and a shaped body. The carrier is a, or the, mechanically supporting constituent of the semiconductor chip that provides the semiconductor chip with at least some of its mechanical stability.

The carrier comprises at least one first conductor body and at least one second conductor body. The semiconductor chip can be supplied with current during operation by way of the conductor bodies.

The conductor bodies are formed as solid bodies, for example, containing or consisting of at least one metal. The conductor bodies can, for example, be provided as solid bodies for production of the carrier, or the conductor bodies are created during production of the carrier, e.g., by electroless deposition or electroplating. The conductor bodies are distinguished by high electrical conductivity as well as high thermal conductivity. The conductor bodies can be formed in one piece or multiple pieces. The first and second conductor bodies are at different electrical potentials during operation of the semiconductor chip. If a conductor body is formed in multiple pieces, all pieces of the conductor body formed in multiple pieces are at the same electrical potential. The carrier further comprises a shaped body. The shaped body is formed using an electrically insulating material. For example, the shaped body can be formed using a plastics material. The shaped body can enclose the conductor bodies of the carrier completely in lateral directions. The lateral directions in this case are those directions that run parallel to a main extension plane of the semiconductor chip. It is possible in this case that the conductor bodies penetrate the shaped body completely. The conductor bodies can be flush with the shaped body on a top side of the carrier facing towards the semiconductor body and a side of the carrier facing away from the semiconductor body.

The shaped body can be molded on to the conductor bodies. In particular, a direct interface can be present between the shaped body and the conductor bodies. For example, the material of the shaped body can be flowable for molding on to the conductor bodies and can solidify after being molded thereon. The shaped body isolates the first and second conductor bodies from one another electrically such that an electrical connection of the semiconductor body is possible by way of the conductor bodies. Side faces of the carrier that link together the top side and the bottom side of the carrier can be formed entirely with the shaped body, for example, such that the conductor bodies are accessible for further contacting only on the bottom side of the carrier facing away from the semiconductor body. The shaped body can be formed in one piece. The shaped body can be formed using a matrix material comprising, e.g., a thermoplastic and/or a thermoset and/or an epoxy material and/or a silicone material. Fillers can be incorporated into the matrix material that affect mechanical, thermal and/or optical properties of the shaped body.

The semiconductor chip may comprise an electrically insulating layer comprising at least one first opening and at least one second opening. The electrically insulating layer is formed using, e.g., a dielectric material. The electrically insulating layer can contain or consist of, e.g., one of the following materials: oxide, nitride, silicone, epoxy resin, polymer. In particular, it is also possible that the electrically insulating layer is formed using the same material as the shaped body or the same material as the matrix material of the shaped body. The openings in the electrically insulating layer completely penetrate the electrically insulating layer. No material of the electrically insulating layer is present in the region of the openings.

The electrically insulating layer has a thickness in a vertical direction running perpendicular to the lateral direction, which thickness is less than the thickness of the shaped body. For example, the thickness of the electrically insulating layer is no more than 10% of the thickness of the shaped body. In this way, the electrically insulating layer barely represents an obstacle to heat, which is brought to it by way of the conductor bodies and the shaped body.

The semiconductor chip may comprise at least one first connection point that is electrically conductive, and at least one second connection point that is electrically conductive. The connection points are used to contact the semiconductor chip from the outside and are arranged, e.g., on a common surface, for example, on the bottom side of the semiconductor chip. The semiconductor chip in this case can in particular be surface mountable. The connection points are formed using an electrically conductive material and can comprise one or more metals. In particular, the connection points can have an external surface facing away from the semiconductor body, which is distinguished by good joining characteristics, e.g., good solderability.

The carrier may connect to the semiconductor body in a mechanically firm manner, i.e., the carrier can only be detached from the semiconductor body if the semiconductor chip is destroyed. For example, the carrier connects to the semiconductor body by way of a connecting region. In the connecting region, contact layers and insulation layers can be present, by which current is carried from the conductor body to the active region of the semiconductor body. For example, the carrier, on its top side facing towards the semiconductor body, directly borders the connecting region and the connecting region, on its top side facing away from the carrier, directly borders the semiconductor body.

The first connection point may electrically connect to the first conductor body through the first opening and the second connection point may electrically connect to the second conductor body through the second opening. In the event that the semiconductor chip comprises more than one first connection point and/or more than one second connection point, the connection points can connect to one or more corresponding conductor bodies by way of corresponding further openings.

In particular, it is possible that the material of a connection point completely or partly fills the associated opening in the electrically insulating layer and is in direct contact with the associated conductor body.

The first conductor body may be at a first distance from the second conductor body and the first connection point may be at a second distance from the second connection point, the first distance being less than the second distance. In other words, e.g., in a plane parallel to the main extension plane of the semiconductor chip, the first conductor body and the second conductor body are closer to one another than the first connection point and the second connection point.

A semiconductor chip have
 a semiconductor body comprising an active region,
 a carrier comprising a first conductor body, a second conductor body and a shaped body,
 an electrically insulating layer comprising a first opening and a second opening,
 a first connection point that is electrically conductive, and
 a second connection point that is electrically conductive, wherein
 the carrier mechanically connects to the semiconductor body,
 the active region electrically connects to the first conductor body and the second conductor body,
 the electrically insulating layer covers the carrier on the side thereof facing away from the semiconductor body, the first connection point electrically connects to the first conductor body through the first opening, the second connection point electrically connects to the second conductor body through the second opening, the first conductor body is at a first distance from the second conductor body, the first connection point is at a second distance from the second connection point, and the first distance is less than the second distance.

The semiconductor chip is based inter alia on the finding that a cross-section of the conductor bodies in a plane parallel to the main extension plane of the semiconductor chip is crucial to the thermal behavior of the semiconductor chip. The greater the cross-section of the conductor bodies, the better can be the dissipation of heat from the active region by way of the conductor bodies. In particular, a large distance between the conductor bodies leads to inhomogeneous heat dissipation from the semiconductor body and thus to losses in efficiency. Moreover, inhomogeneous heat dissipation can lead to an inhomogeneous illumination pattern and locally elevated temperatures in the semiconductor chip that ultimately results in more rapid ageing of the semiconductor chip.

On the other hand, the distance selected between the conductor bodies, in the event that a contacting of the semiconductor chip from the outside takes place directly by way of the conductor bodies and they are therefore exposed on the bottom side of the semiconductor chip, should not be too small since otherwise a minimum distance necessary, e.g., to connect the semiconductor chip by soldering, is not maintained. A semiconductor component surprisingly reconciles the two conflicting requirements mentioned above—a small distance between the conductor bodies to improve the thermal properties and a large distance between the connection points to facilitate a joining process, in particular a soldering process.

The first distance here, i.e., the distance between the conductor bodies, is, e.g., at least 10 μm and no more than 100 μm. In particular, the distance between the conductor bodies can be at least 40 μm and no more than 60 μm.

The second distance between the connection points can be, e.g., at least 30 μm and no more than 250 μm, in particular at least 60 μm and no more than 150 μm.

In particular, it is possible that the second distance is at least 1.45 times the first distance.

In the semiconductor chip described here, an insulating layer is deposited on the bottom side of the carrier facing away from the semiconductor body, which insulating layer insulates the conductor bodies on their bottom side facing away from the semiconductor body and forms a new, electrically insulating rear side of the semiconductor chip. The electrically insulating layer is open at points where the connection points are formed, and the connection points connect to the electrical conductor bodies by way of this opening. In this way, it is possible to form the conductor bodies with a spacing which is as small as possible without having to observe any limitations in the subsequent joining process of the semiconductor chip.

This results in a semiconductor chip having controlled thermal behavior and therefore improved efficiency.

The electrically insulating layer may directly border the conductor bodies, the connection points and the shaped body in some regions. In other words, there is an interface between the electrically insulating layer and the conductor bodies, the connection points and the shaped body, in which the electrically insulating layer is in direct contact with these constituents of the semiconductor chip. For example, the material of the electrically insulating layer here is selected such that particularly good adhesion exists with the shaped body in particular. This can be achieved, e.g., by the shaped body and the electrically insulating layer containing or consisting of the same material. In this way, the risk of detachment of the electrically insulating layer from the carrier is reduced. The connection points are, e.g., in direct contact with the electrically insulating layer in the region of the openings and on the bottom side of the electrically insulating layer facing away from the semiconductor body.

The shaped body may surround the conductor bodies completely in lateral directions. In other words, the conductor bodies are embedded in the shaped body. Side faces of the conductor bodies are not exposed at any point, for example, such that besides the shaped body, the conductor bodies only border a connecting region, which is arranged between semiconductor body and carrier, and the electrically insulating layer as well as the connection point associated with the semiconductor body. In this way, it is ensured that the conductor bodies connect to the shaped body in a mechanically firm manner, which increases the mechanical stability of the carrier and therefore of the semiconductor chip overall. Moreover, it is ensured that the conductor bodies are not exposed at any point at the edge of the semiconductor chip and in this way the semiconductor chip cannot be edge-contacted.

At least one of the conductor bodies may comprise a protrusion. The protrusion extends, e.g., in a lateral direction, i.e., in a direction parallel to the main extension plane of the semiconductor chip. For example, the protrusion can be formed in the manner of a groove extending in a vertical direction, in a direction perpendicular to the lateral directions, along the entire conductor body and that forms a serration in a cross-section of the conductor body parallel to the main extension plane of the semiconductor chip. In particular, it is possible that the conductor body has two or more of these protrusions that can each extend in a vertical direction over the entire length of the conductor body. The conductor body can then have at least approximately the shape of an "F," an "E," a comb with a plurality of teeth and/or a star in the cross-section parallel to the main extension plane of the semiconductor chip, for example. In particular, the base area of the conductor body in a cross-section parallel to the main extension plane of the semiconductor chip is simply connected and star-shaped.

At least one of the conductor bodies may have a star-like or comb-like shape in a top view of a bottom side of the at least one conductor body facing away from the semiconductor body, wherein the at least one conductor body has at least two protrusions, for example, forming the teeth of the comb-like shape, and between the protrusions, forming recessed regions that are free from the material of the at least one conductor body. In other words, in the cross-section in a plane parallel to the main extension plane of the semiconductor chip, at least one of the conductor bodies is provided with a plurality of protrusions. Each of the protrusions has a main extension direction along which the protrusion extends. The main extension directions of different protrusions can run parallel to one another in this case. Between the protrusions, no material of the conductor body is present, but recessed regions are present that are free from the material of the at least one conductor body and filled, e.g., with material of the shaped body in the carrier.

A conductor body having a star-like or comb-like shape is distinguished by a particularly large surface area on which it can be in direct contact with the shaped body of the carrier. Owing to this large contact area and the fact that the protrusions of the comb-like or star-like structure anchor the conductor body in the shaped body, a carrier and therefore a semiconductor chip with conductor bodies of this configuration has improved mechanical stability. At least one protrusion may extend from the at least one conductor body in which a protrusion is formed towards the other conductor body in the carrier. In other words, the at least one conductor body extends at least partly towards the other conductor body, whereby a particularly small distance between the conductor bodies can be achieved.

At least two conductor bodies may have the star-like or comb-like shape in a top view of a bottom side of the at least one conductor body facing away from the semiconductor body, wherein at least one protrusion of a conductor body protrudes into the recessed region of the other conductor body. In other words, the protrusions of one conductor body can protrude into the recessed regions of the other conductor body in pairs such that, in a cross-section parallel to the main extension plane of the semiconductor chip, protrusions of the one and of the other conductor body are arranged alternately along a line running between the conductor bodies. In this way, the distance between the conductor bodies along at least one lateral direction can be zero in this plane.

The conductor bodies are arranged particularly close to one another in this way and, owing to the star-like or comb-like configuration, they have a particularly large area. In this way, a particularly even heating of the semiconductor body takes place since material of the conductor bodies is also present in the region between two conductor bodies. Together with the large area of the conductor bodies configured in this way, this leads to particularly effective and even dissipation of heat from the semiconductor body.

Owing to the electrically insulating layer and the contacting of the conductor bodies through the opening in the electrically insulating layer, connection points can be geometrically configured independently of the shaping of the conductor bodies and so good contacting can be achieved at the same time as the good thermal properties.

The conductor bodies having an intermeshing configuration as a result of the protrusions have, in other words, a mutually interlocking configuration, wherein open regions between the conductor bodies are filled with material of the shaped body. Interlocking the conductor bodies surprisingly entails the advantage that a susceptibility of the carrier to mechanical breakage is reduced. Thus, particularly in the central region of the carrier, there is no straight line in a plane parallel to the main extension direction of the semiconductor chip running exclusively in the material of the shaped body. Instead, each straight line in a plane parallel to the main extension direction of the semiconductor chip, at least in the central region of the carrier, will run through at least one of the conductor bodies. It is therefore impossible for the carrier to break apart along a line between the conductor bodies.

At least one of the conductor bodies may be formed in multiple pieces. The conductor body in this case is formed, for example, using multiple solid bodies arranged adjacent to one another, in particular without any direct contact with one another. The pieces of the conductor body can be connected to the same connection point. Moreover, it is possible that the connection points are also formed in multiple pieces in this case and, e.g., each piece of the first conductor body connects to a first connection point, all first connection points being at the same electrical potential during operation of the semiconductor chip. The same applies mutatis mutandis to pieces of the second conductor body and the associated second connection points. In this example, it is in particular also possible that one of the conductor bodies is formed in multiple pieces and another conductor body is formed in one piece.

The first connection point may partly cover the first conductor body and the second conductor body in each case. Moreover, the second connection point can partly cover the first conductor body and the second conductor body in each case. This is the case particularly when the conductor bodies are in a mutually interlocking arrangement. Although the first connection point then electrically connects only to the first conductor body, however, it is arranged on the side of the electrically insulating layer facing away from the conductor bodies such that, besides the first conductor body, regions of the second conductor body are also covered. The same applies mutatis mutandis to the second connection point.

The first opening has a smaller cross-sectional area than the first connection point and/or the second opening has a smaller cross-sectional area than the second connection point. In other words, the connection points each have a base area which is larger than the base area of the associated opening on the bottom side of the semiconductor chip, for example. In other words, the openings are selected to be only so large that a sufficiently good electrical contact can be made between connection point and associated conductor body. The openings in the electrically insulating layer are kept as small as possible in terms of their cross-sectional area, which contributes to the mechanical stabilizing of the electrically insulating layer.

The first connection point may be surrounded in lateral directions by the first opening and has a smaller cross-sectional area than the first opening and/or the second connection point is surrounded in lateral directions by the second opening and has a smaller cross-sectional area than the second opening. For example, the openings are created by a mask technique and subsequent isotropic etching, for example, wet-chemically. Using the same mask, the connection points can then be created, for example, by a directional deposition method such as for instance evaporation in the openings. The connection points in this case can each be at a distance from the electrically insulating layer in lateral directions such that the associated opening surrounds the connection point and the connection point does not completely fill the associated opening. In this case, it is possible that the electrically insulating layer completely encircles the connection points in lateral directions and the electrically insulating layer protrudes beyond the connection point in a vertical direction. Although the connection points are not particularly large in this case, they are, however, particularly well protected by the electrically insulating layer.

The semiconductor chip described here is explained in more detail below with the aid of examples and the associated figures.

Identical or similar elements or elements having the same effect are provided with the same reference signs in the figures. The figures and the size ratios to one another of the elements illustrated in the figures should not be considered as being to scale. Rather, to illustrate them better and/or to make them easier to understand, the size of individual elements may be exaggerated.

In association with the sectional diagram of FIG. 1A, an example of a semiconductor chip as described here is explained in more detail. The semiconductor chip comprises a semiconductor body 1, a connecting region 2 and a carrier 3. The semiconductor body 1 mechanically and electrically connects to the carrier 3 by way of the connecting region 2.

The semiconductor body 1 comprises, e.g., a first conductive region 11, which can be of an n-type configuration, for example, an active region 12 and a second conductive region 13, which can be, e.g., of a p-type configuration. During operation of the semiconductor chip, a function of the semiconductor chip takes place in the active region. For example, the semiconductor chip can be a radiation-emitting semiconductor chip, in which light is generated in the active region during operation.

The semiconductor body connects to the carrier 3 in a mechanically firm and electrically conductive manner by way of the connecting region 2. The connecting region 2 comprises, e.g., a first contact layer 21, by way of which a contact is made with the second conductive region 13 of the semiconductor body, and a second contact layer 22, by way of which a contact can be made with the first conductive region 11. For example, the first conductive region 11 is contacted by the second contact layer 22 by way of a through-connection 24. The through-connection 24 and the second contact layer 22 can be electrically separated from the first contact layer 21 by an insulation layer 23. The through-connection 24 in this case extends from the side of the semiconductor body 1 facing towards the carrier 3 through the second conductive region 13 and the active region 12 into the first conductive region 11.

In the example of FIG. 1A, the first contact layer 21 and the second contact layer 22 run parallel to one another in some places and overlap in a vertical direction V running perpendicular to the lateral directions L, which run parallel to a main extension plane of the semiconductor chip.

The connecting region 2 in this case can comprise further layers designed to conduct current and/or to perform other functions in the semiconductor chip such as, e.g., a reflection of electromagnetic radiation.

In addition, it is possible that the semiconductor body 1 and the connecting region 2 are formed differently from the illustration. For example, the semiconductor body 1 could be contacted without a through-connection or contact layers of the connecting region 2 do not run one above the other in a vertical direction.

The semiconductor body 1 connects to the carrier by way of the connecting region 2 such that it cannot be mechanically detached. In other words, the semiconductor body 1 can only be detached from the carrier 3 if at least one of the constituents of the semiconductor chip is destroyed. The carrier 3 in this example comprises a first conductor body 31 and a second conductor body 32. The first conductor body 31 electrically connects to the first contact layer 21 and the second conductor body 32 electrically connects to the second contact layer 22. The conductor bodies 31, 32 are formed using, e.g., a metal and are created by electroplating, wherein a layer of the connecting region 2 can act as a seed layer for deposition of the conductor bodies by electroplating. Moreover, it is possible that the conductor bodies are formed as solid bodies connected to the semiconductor body by way of solder layers, which can likewise be part of the connecting region 2.

The conductor bodies 31, 32 are completely surrounded by the shaped body 33 in the lateral directions L and are each flush with the shaped body 33 on the top side of the carrier 3 facing towards the semiconductor body 1 and the bottom side of the carrier 3 facing away from the semiconductor body 1.

The conductor bodies 31, 32 are arranged at a distance D1 from one another in this case.

The semiconductor chip further comprises an electrically insulating layer 4 arranged on the bottom side of the carrier 3 facing away from the semiconductor body 1 and covers this completely apart from openings 41, 42. In the openings 41, 42 directly bordering the conductor bodies 31, 32, corresponding connection points 51, 52 are arranged that are formed using, e.g., metal and in direct contact with the conductor bodies 31, 32 in the openings. The connection points 51, 52 have, on the bottom side of the semiconductor chip, a cross-sectional area smaller than the cross-sectional area of the conductor bodies 31, 32. The cross-sectional area of the openings 41, 42 is in turn smaller than the cross-sectional area of the connection points 51, 52.

The connection points 51, 52 are arranged at a distance D2 from one another, which is in turn greater than the distance D1 between the conductor bodies 31, 32.

In the semiconductor chip, the conductor bodies 31, 32 can be arranged particularly close to one another without particular attention having to be paid to short-circuit-free solderability of the conductor bodies 31, 32 on the bottom side of the carrier 3. To connect the semiconductor chip, connection points 51, 52 are formed that are arranged at a greater distance from one another than the distance between the conductor bodies 31, 32.

To produce the semiconductor chip, the semiconductor body 1 can first be prepared with the connecting layer 2 on its bottom side. Next, the conductor bodies 31, 32 can be created or deposited and a deposition of the shaped body 33 takes place, for example, by potting. On the carrier produced in this way, the electrically insulating layer 4 is produced on the bottom side, for example, by sputtering, evaporation, potting or printing. In the electrically insulating layer 4, openings 41, 42 are left open during production or are created afterwards. In the openings, the first and second connection points 51, 52 are created.

Figure 1B:
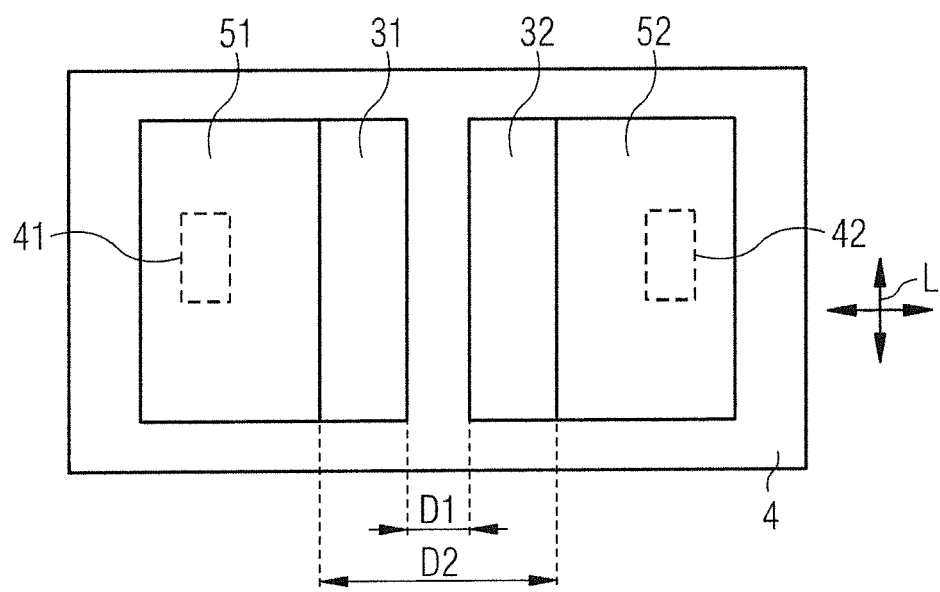

FIG. 1B shows a top view of a bottom side of the semiconductor chip facing away from the semiconductor body 1. In the example of FIG. 1B, it can be seen that the conductor bodies 31, 32 have a cross-sectional area larger than the cross-sectional area of the connection points 51, 52, the cross-sectional area of the openings 41, 42 in turn being smaller than the cross-sectional area of the connection points 51, 52.

In association with the top view diagram of FIG. 1C, a further example of a semiconductor chip as described here is explained in more detail. In this example, the conductor bodies 31, 32 each have protrusions 311, 312, 321, 322 extending towards the other conductor body. The protrusions protrude into recessed regions 323 of the other conductor body 31, 32 in each case. In this way, protrusions of the first conductor body 31 and the second conductor body 32 are arranged alternately along the broken line S. The regions between the protrusions are filled with material of the shaped body 33 that electrically isolates the conductor bodies 31, 32 from one another.

In the example of FIG. 1C, the conductor bodies 31, 32 are therefore formed in a comb-like manner with the protrusions forming the teeth of the comb-like structure. The conductor bodies in this case are arranged such that they are mutually interlocked. In one of the lateral directions L, the conductor bodies 31, 32 are therefore at a distance from one another of zero. In this way, material of the conductor bodies is also arranged in the region between the conductor bodies such that the semiconductor body becomes efficient in this region too, differing from the example of FIGS. 1A and 1B. In addition, the protrusions of the anchoring in the shaped body increase the mechanical stability of the carrier 3 and therefore of the semiconductor chip.

Overall, a semiconductor chip as described here is distinguished by very good thermal stability and high mechanical stability.

Figure 2:
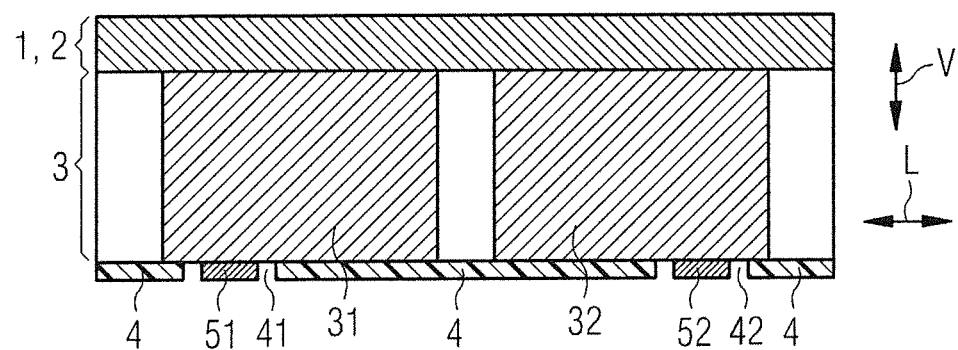
FIG. 2 shows a further example of a semiconductor chip in a sectional diagram.

FIG. 2 shows a further example of a semiconductor chip as described here in a sectional diagram. In this example of the semiconductor chip, the first connection point 51 is surrounded in lateral directions L by the first opening 41 and has a smaller cross-sectional area than the first opening 41. The second connection point 52 can be configured as illustrated in association with FIG. 1B or the second connection point 52 is likewise surrounded in lateral directions L by the second opening 42 and therefore has a smaller cross-sectional area than the second opening 42.

The connection points 51, 52 can therefore each be at a distance from the electrically insulating layer 4 in lateral directions L so that the associated opening 41, 42 surrounds the associated connection point 51, 52 and the connection point 51, 52 does not completely fill the associated opening 41, 42. In this case, it is possible that the electrically insulating layer 4 completely encircles the connection points 51, 52 in lateral directions L and the electrically insulating layer 4 protrudes beyond the connection point 51, 52 in a vertical direction V.

Figure 3:
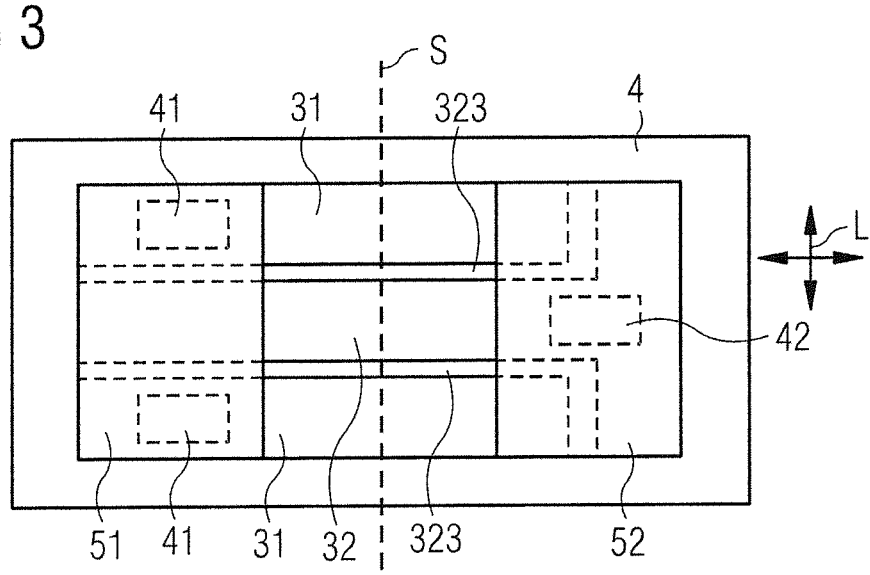
FIG. 3 shows a further example of a semiconductor chip in a top view diagram.

FIG. 3 shows a further example of a semiconductor chip as described here in a top view diagram. In this example, the first conductor body 31 is formed in two pieces. In the electrically insulating layer 4, two first openings 41 are formed, in which the two pieces of the first conductor body 31 are exposed and contacted by the single first connection point 51. However, it is also possible here that each piece of the first conductor body 31 is allocated a first connection point 51 of its own, which can then, for example, have a smaller cross-sectional area than the allocated first opening 41 as shown in FIG. 2. The second conductor body 32 in the example of FIG. 3 is formed in one piece and is arranged between the two pieces of the first conductor body 31 along the line S.

The description with the aid of the examples does not limit our semiconductor chips thereto. Rather, this disclosure comprises any new feature and any combination of features that in particular include any combination of features in the appended claims, even if the feature or combination is not itself explicitly stated in the claims or examples.

Priority of DE 102015113310.5 is claimed, the subject matter of which is incorporated herein by reference.

The invention claimed is:

1. A semiconductor chip comprising:
a semiconductor body comprising an active region,
a carrier comprising a first conductor body, a second conductor body and a shaped body,
an electrically insulating layer comprising a first opening and a second opening,
an electrically conductive first connection point, and
an electrically conductive second connection point, wherein
the carrier is a mechanically supporting constituent of the semiconductor chip,
the carrier mechanically connects to the semiconductor body,
a first side of the active region electrically connects to the first conductor body and a side of said active region opposite the first side in a vertical direction electrically connects to the second conductor body,
the electrically insulating layer covers the carrier on the side thereof facing away from the semiconductor body,
the first connection point electrically connects to the first conductor body through the first opening,
the second connection point electrically connects to the second conductor body through the second opening,
the first conductor body is at a first distance from a second conductor body,
the first connection point is at a second distance from the second connection point, and
the first distance is less than the second distance.

2. The semiconductor chip according to claim 1, wherein the electrically insulating layer directly borders the conductor bodies, the connection points and the shaped body in some regions.

3. The semiconductor chip according to claim 1, wherein the shaped body completely surrounds the conductor bodies in lateral directions.

4. The semiconductor chip according to claim 1, wherein at least one of the conductor bodies comprises at least one protrusion.

5. The semiconductor chip according to claim 4, wherein the at least one protrusion extends from the at least one conductor body towards the other conductor body.

6. The semiconductor chip according to claim 1, wherein at least one of the conductor bodies has a star-like and/or comb-like shape in a top view of a bottom side of the at least one conductor body facing away from the semiconductor body, and the at least one conductor body has at least two protrusions that can form the teeth of the comb-like shape, and between the protrusions, recessed regions are formed that are free from the material of the at least one conductor body.

7. The semiconductor chip according to claim 6, wherein at least two conductor bodies have the star-like and/or comb-like shape, and at least one protrusion of a conductor body protrudes into the recessed region of the other conductor body.

8. The semiconductor chip according to claim 1, wherein at least two conductor bodies are in a mutually interlocking arrangement.

9. The semiconductor chip according to claim 1, wherein the first opening has a smaller cross-sectional area than the first connection point and/or the second opening has a smaller cross-sectional area than the second connection point.

10. The semiconductor chip according to claim 1, wherein the first connection point is surrounded in lateral directions by the first opening and has a smaller cross-sectional area than the first opening and/or the second connection point is surrounded in lateral directions by the second opening and has a smaller cross-sectional area than the second opening.

11. The semiconductor chip according to claim 1, wherein the second distance is at least 1.45 times the first distance.

12. The semiconductor chip according to claim 1, wherein the semiconductor chip can be supplied with current during operation by way of the conductor bodies.

13. The semiconductor chip according to claim 1, wherein the first and second conductor bodies are at different electrical potentials during operation of the semiconductor chip.

14. The semiconductor chip according to claim 1, wherein the shaped body is formed with an electrically insulating material.

15. A semiconductor chip comprising:
a semiconductor body comprising an active region,
a carrier comprising a first conductor body, a second conductor body and a shaped body, an electrically insulating layer comprising a first opening and a second opening,
an electrically conductive first connection point, and
an electrically conductive second connection point, wherein
the carrier is a mechanically supporting constituent of the semiconductor chip,
the carrier mechanically connects to the semiconductor body,
a first side of the active region electrically connects to the first conductor body and a side of said active region opposite the first side in a vertical direction electrically connects to the second conductor body,
the electrically insulating layer covers the carrier on the side thereof facing away from the semiconductor body,
the first connection point electrically connects to the first conductor body through the first opening,
the second connection point electrically connects to the second conductor body through the second opening,
the first conductor body is at a first distance from a second conductor body,
the first connection point is at a second distance from the second connection point,
the first distance is less than the second distance, and
at least one of the conductor bodies comprises at least one protrusion, wherein at least one protrusion extends from the at least one conductor body towards the other conductor body.

16. A semiconductor chip comprising:
a semiconductor body comprising an active region,
a carrier comprising a first conductor body, a second conductor body and a shaped body,
an electrically insulating layer comprising a first opening and a second opening,
an electrically conductive first connection point, and
an electrically conductive second connection point, wherein
the carrier mechanically connects to the semiconductor body,
the active region electrically connects to the first conductor body and the second conductor body,
the electrically insulating layer covers the carrier on the side thereof facing away from the semiconductor body,
the first connection point electrically connects to the first conductor body through the first opening,
the second connection point electrically connects to the second conductor body through the second opening,
the first conductor body is at a first distance from a second conductor body,
the first connection point is at a second distance from the second connection point,
the first distance is less than the second distance, and
the first connection point is surrounded in lateral directions by the first opening and has a smaller cross-sectional area than the first opening and/or the second connection point is surrounded in lateral directions by the second opening and has a smaller cross-sectional area than the second opening.

* * * * *